United States Patent
Mahoney et al.

(10) Patent No.: US 10,838,018 B1
(45) Date of Patent: Nov. 17, 2020

(54) MULTIPLE INSERTION TESTING OF TEST SOCKET

(71) Applicant: Xilinx, Inc., San Jose, CA (US)

(72) Inventors: David M. Mahoney, Gilroy, CA (US); Joseph M. Juane, San Jose, CA (US); Owais E. Malik, San Jose, CA (US); Mohsen H. Mardi, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 155 days.

(21) Appl. No.: 16/141,747

(22) Filed: Sep. 25, 2018

(51) Int. Cl.
*G01R 31/69* (2020.01)
*G01R 1/04* (2006.01)
*G01R 31/28* (2006.01)

(52) U.S. Cl.
CPC .......... *G01R 31/69* (2020.01); *G01R 1/0466* (2013.01); *G01R 1/0483* (2013.01); *G01R 31/28* (2013.01)

(58) Field of Classification Search
CPC ...... G01R 31/00; G01R 31/28; G01R 31/282; G01R 31/2851; G01R 31/2855; G01R 31/286; G01R 31/2863; G01R 31/2886; G01R 31/50; G01R 31/66; G01R 31/68; G01R 31/69; G01R 1/00; G01R 1/02; G01R 1/04; G01R 1/0408; G01R 1/0416; G01R 1/0433; G01R 1/0441; G01R 1/045; G01R 1/0466; G01R 1/0483; G01R 1/067
USPC .............. 324/500, 537, 538, 756.01, 756.02, 324/756.03
See application file for complete search history.

(56) References Cited

U.S. PATENT DOCUMENTS

| | | | | |
|---|---|---|---|---|
| 6,809,524 B1* | 10/2004 | Sadler | ................ | G01R 31/2805 324/538 |
| 2006/0066293 A1* | 3/2006 | Gopal | ................ | G01R 31/2867 324/750.14 |
| 2010/0244872 A1* | 9/2010 | Yoshida | ............. | G01R 1/07371 324/754.03 |
| 2010/0295572 A1* | 11/2010 | Ryu | ..................... | G01R 1/0483 324/765.01 |
| 2011/0084720 A1* | 4/2011 | Wu | ...................... | G01R 1/0483 324/756.02 |

FOREIGN PATENT DOCUMENTS

WO    WO-0204966 A2 *  1/2002  ............. G01R 35/00

* cited by examiner

*Primary Examiner* — Hoai-An D. Nguyen
(74) *Attorney, Agent, or Firm* — Patterson + Sheridan, LLP

(57) ABSTRACT

Examples described herein provide for testing of a test socket using multiple insertions to a contact resistance (CRES) test system. In an example, the test socket is placed in a first orientation on an interface board electrically connected to a test system. Using the test system and through the interface board, a first subset of probes of the test socket is tested while the test socket is in the first orientation on the interface board. The test socket is placed in a second orientation different from the first orientation on the interface board. Using the test system and through the interface board, a second subset of probes of the test socket is tested while the test socket is in the second orientation on the interface board. At least some probes of the second subset of probes are different from the first subset of probes.

19 Claims, 13 Drawing Sheets

US 10,838,018 B1

MULTIPLE INSERTION TESTING OF TEST SOCKET

TECHNICAL FIELD

Examples of the present disclosure generally relate to testing of a test socket that is used to test electronic devices and, in particular, to multiple insertion testing of a test socket.

BACKGROUND

An integrated circuit is typically fabricated on a semiconductor die that is then incorporated in a package that encapsulates the semiconductor die. A package can include one or multiple semiconductor dice. Once the package is formed, the package is typically tested to ensure that the package meets functionality requirements before being incorporated into another component.

Testing a package usually includes using a test socket to probe electrical interconnects (e.g., solder pads and/or solder balls) of the package and to act as an interface between the package and test equipment. To help ensure that defects of the test socket are not improperly attributed to a package under test, the test socket is generally periodically tested to ensure that the test socket remains within some performance specification. If the testing of the test socket reveals a defect in the test socket, the test socket can be reworked until the defect is removed, and the test socket can be used again in testing packages.

SUMMARY

Examples described herein provide for testing of a test socket using multiple insertions to a contact resistance (CRES) test system. In examples describe herein, the multiple insertions can extend the testing capabilities of the CRES test system to test sockets having a probe array size that is larger. This can obviate having to replace the CRES test system with a larger, and costly, CRES test system when the number of probes of the test socket exceeds the number of channels of the CRES test system.

An example of the present disclosure is a method for testing a test socket. The test socket is placed in a first orientation on an interface board electrically connected to a test system. Using the test system and through the interface board, a first subset of probes of the test socket is tested while the test socket is in the first orientation on the interface board. The test socket is placed in a second orientation different from the first orientation on the interface board. Using the test system and through the interface board, a second subset of probes of the test socket is tested while the test socket is in the second orientation on the interface board. At least some probes of the second subset of probes are different from the first subset of probes.

Another example of the present disclosure is a testing apparatus. The testing apparatus includes a contact resistance (CRES) test system and an interface board on the CRES test system. The interface board has backside pads that are electrically connected to external connectors of the CRES test system. The interface board has frontside pads arranged in a pad array. The frontside pads are electrically connected to the backside pads via interconnects of the interface board. The pad array has a number of columns of frontside pads and a number of rows of frontside pads. The number of rows of frontside pads is greater than the number of columns of frontside pads.

A further example of the present disclosure is a method for testing a test socket. A first subset of a square array of probes of the test socket is placed in electrical contact with at least some of an array of pads on an interface board. The array of pads is electrically connected to a test system. When placed, a second subset of the square array of probes is not in electrical contact with the array of pads. Using the test system and through the at least some of the array of pads, the first subset of the square array of probes of the test socket is tested. The second subset of the square array of probes of the test socket is placed in electrical contact with the at least some of the array of pads on the interface board. When placed, at least some of the first subset of the square array of probes are not in electrical contact with the array of pads. Using the test system and through the at least some of the array of pads, the second subset of the square array of probes of the test socket is tested.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
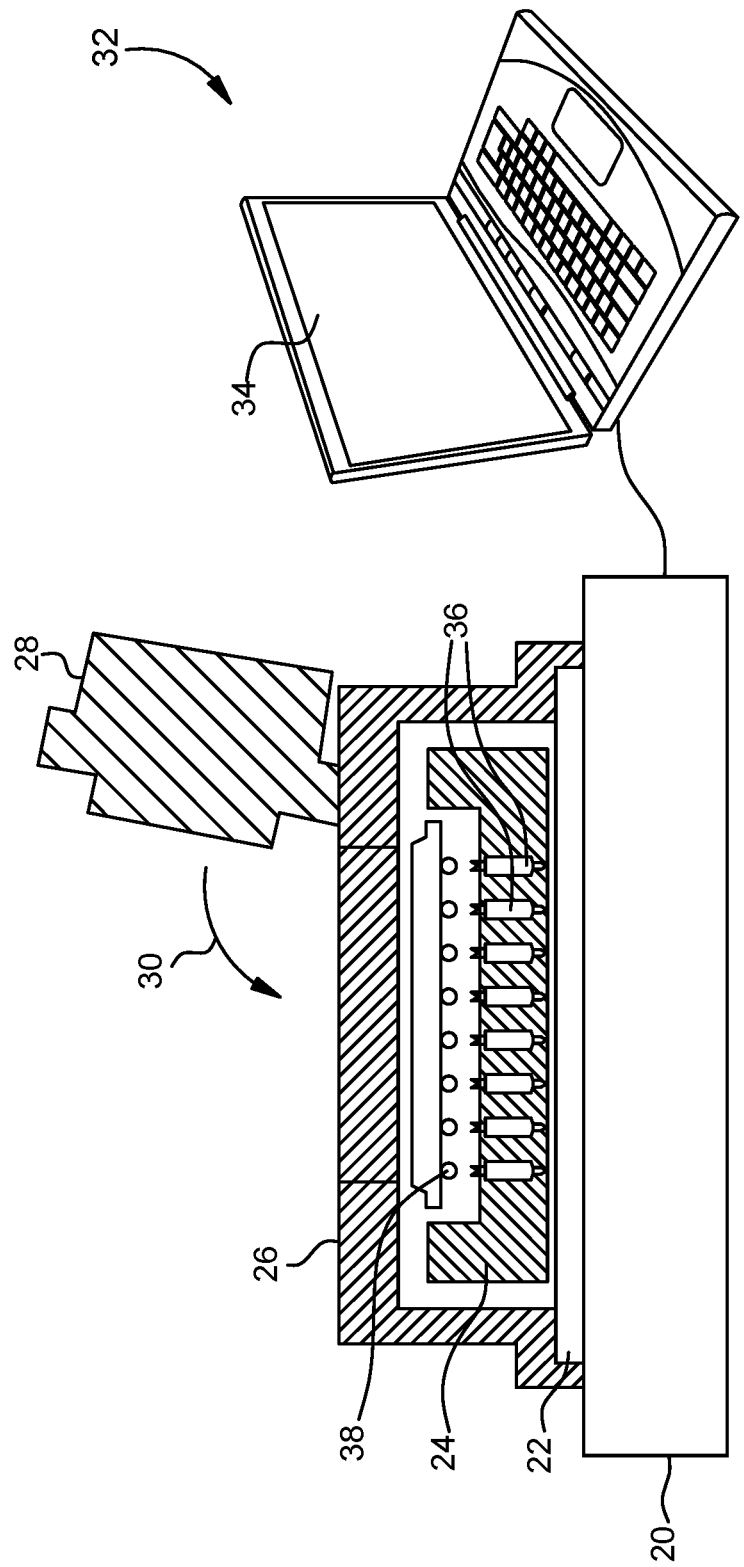
FIG. 1 is a simplified schematic of a testing environment for testing a test socket, according to some examples.

Examples described herein provide for testing of a test socket using multiple insertions to a contact resistance (CRES) test system. In examples describe herein, an interface board on a CRES test system has a pad array that is non-square (e.g., rectangular). The non-square pad array permits multiple insertions of a test socket to test the test socket, where the test socket has a probe array (e.g., a square probe array) that exceeds the number of pads of the pad array and exceeds the number of channels of the CRES test system. The multiple insertions can extend the testing capabilities of the CRES test system to test sockets having a probe array size that is larger. This can obviate having to replace the CRES test system with a larger, and costly, CRES test system when the number of probes of the test socket exceeds the number of channels of the CRES test system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods and processes described herein may be implemented in orders differing from what is described herein.

Additionally, various aspects are described in the context of the illustrated examples. A person having ordinary skill in the art will readily understand that these aspects can be extended to other contexts for other examples. For example, various arrays described herein can be different shapes. Further, arrays can be different configurations (e.g., a honeycomb array) from what is described below. Rows and columns described below are for ease of reference. A row and column for any given instance may also be considered a column and row, respectively.

FIG. 1 illustrates a simplified schematic of a testing environment for testing a test socket, according to some examples. The testing environment includes a contact resistance (CRES) test system 20. An example CRES test system 20 includes the Contact Resistance Tester CR-2600 previously available from Antares Advanced Test Technologies. An interface board 22 is mechanically attached to the CRES test system 20. The interface board 22 can be a printed circuit board (PCB) that includes metal interconnects that route electrical signals from backside pads (to which external connectors of the CRES test system 20 contact) to frontside pads (to which probes 36 of a test socket 24 that is under test contact). The interface board 22 can be mechanically attached to the CRES test system 20 by screws or other attachment mechanisms. A frame 26 is mechanically attached to the CRES test system 20 and/or the interface board 22. The frame 26 can be mechanically attached to or through the interface board 22 and/or to the CRES test system 20 by screws or other attachment mechanisms. A lid 28 is mechanically attached to the frame 26 by a hinge, which permits the lid 28 to close onto the frame 26 by rotation 30. A locking mechanism may secure the lid 28 in a closed position on the frame 26.

A processor-based system 32 (e.g., a computer) is communicatively coupled to the CRES test system 20. The processor-based system 32 executes program instruction code that operates a tester program that further operates a graphical user interface (GUI) 34 on a display device of the processor-based system 32. The GUI 34 is operable to prompt a user for commands, which in turn cause the processor-based system 32, by execution of program instruction code of the tester program, to initiate and/or control testing by the CRES test system 20, and to display results of testing performed on the test socket 24.

The test socket 24 is inserted through the frame (while the lid 28 is in an opened position) and is placed and secured on the interface board 22 for testing. The test socket 24 can be secured on the interface board 22 by screws or other attachment mechanisms, which may further enable properly aligning the test socket 24 with the interface board 22. The test socket 24 includes probes 36 (e.g., pogo pins). The probes 36 can be arranged in the test socket 24 in any configuration to be used to test other interconnects, such as pads or solder balls on a package (which package may or may not be consistent with any Joint Electron Device Engineering Council (JEDEC) standard). A shorting device 38 is placed on the test socket 24 to electrically short the probes 36 during testing. The shorting device 38 is a low resistance material configured to electrically connect to the probes 36 during testing. In some examples, the shorting device 38 is gold-plate brass, copper, or another material. With the test socket 24 and shorting device 38 inserted into the frame 26, the lid 28 is closed such that the lid 28, in the closed position, secures the shorting device 38 in electrical connection to the probes 36 of the test socket 24.

The CRES test system 20 has a given number of external connectors to which backside pads on the interface board 22 may be electrically connected. This number of external connectors may, at least in part, define a number of channels that are available by the CRES test system 20 for testing a test socket 24. The respective numbers of external connectors and channels of the CRES test system 20 can be a limit to the number of probes 36 tested on a test socket 24 during any single test insertion.

In some examples, the frontside pads on the interface board 22 to which the probes 36 of the test socket 24 make electrical contact and through which the probes 36 are tested during testing are arranged in a non-square array. The non-square array of the frontside pads permits an increase in the number of rows or column in the non-square array compared to a square array of the same or near number of frontside pads. The increase in the number of rows or columns can result in a decrease in the number of columns or rows, respectively, relative to a same or near number of frontside pads in a square array. For example, a 50×50 array has 2500 frontside pads, whereas a 52×48 array has 2496 frontside pads. Further, frontside dummy pads may be included on the interface board 22. Some probes 36 may contact the frontside dummy pads during testing, but the frontside dummy pads are not electrically connected through the interface board 22 to the CRES test system 20. Hence, any probes 36 contacting the frontside dummy pads during an insertion are not tested by that insertion. Considering the frontside pads that are capable of testing probes 36 (e.g., that are electrically connected to the CRES test system 20 through the interface board 22) and the frontside dummy pads, a square array of frontside pads and frontside dummy pads may be formed on the interface board 22.

By increasing a number of rows or columns of the frontside pads capable of testing probes 36, the total array size of the probes 36 of the test socket 24 that is capable of being tested can be increased by using multiple test insertions. The multiple test insertions can effectively time-division multiplex the testing of the probes 36 of the test socket 24. In some examples, a first subset of the probes 36 is tested during a first test insertion, and a second subset of the probes 36 (which may or may not overlap with the first subset) is tested during a second test insertion. The results of the test insertions can be combined into a result displayed on the GUI 34 for the entire array of probes 36 of the test socket 24.

Figure 2:
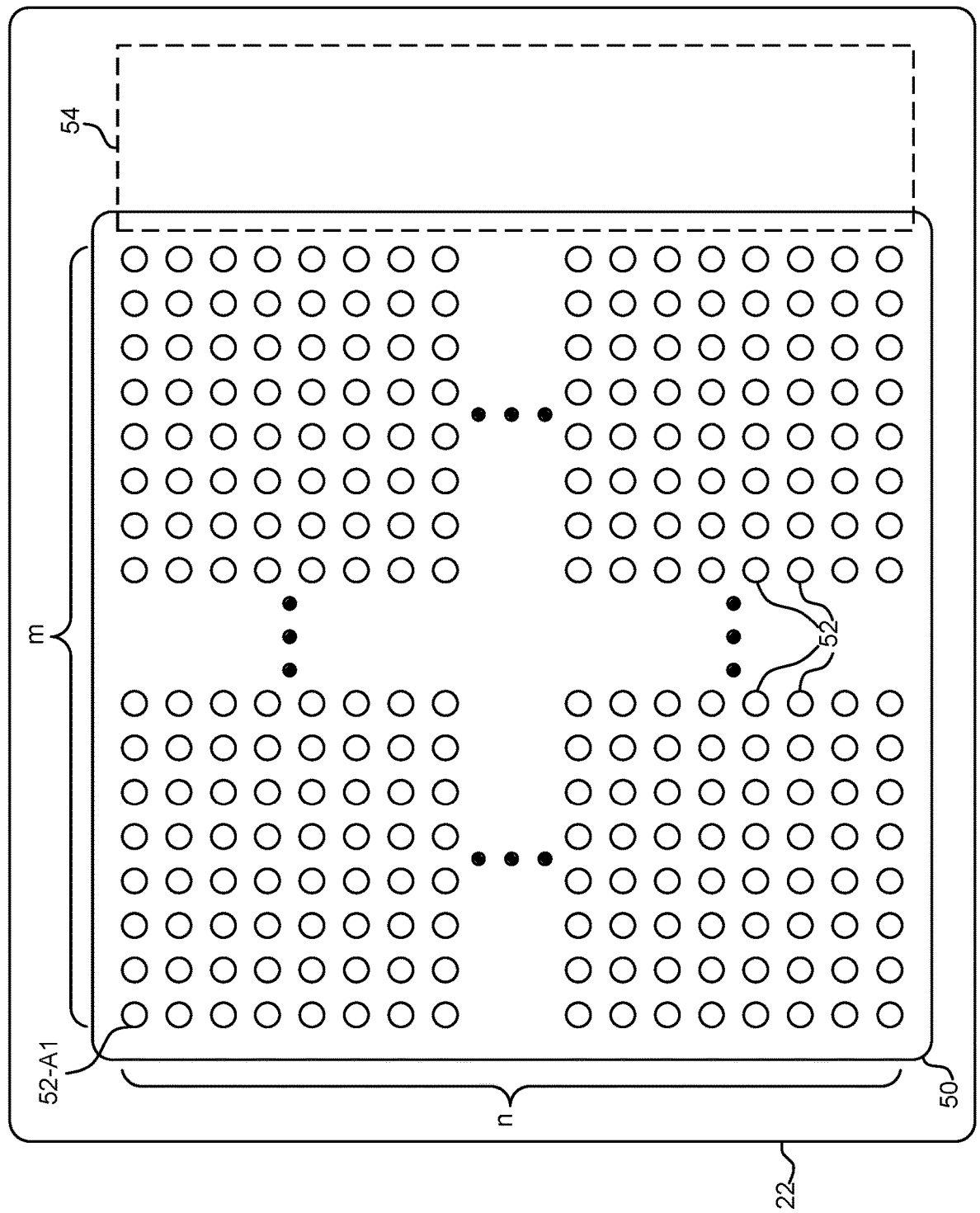
FIG. 2 is a simplified layout of an interface board, according to some examples.

FIG. 2 illustrates a simplified layout of an interface board 22, according to some examples. The interface board 22 includes a pad array area 50 including an array of frontside pads 52. The frontside pads 52 are in an array of m-columns and n-rows, where n is greater than m (e.g., the array includes more rows than columns). The frontside pads 52 can be metal pads on the interface board 22 to which the probes 36 make electrical contact during testing. Frontside pad 52-A1 is labeled for reference and consistent with common practice where rows are indicated by an alphabetic reference and columns are indicated by a numeral reference.

The interface board 22 further includes a dummy landing area 54. The dummy landing area 54 can be any area of the interface board 22 to which some probes 36 may make contact, and are not tested, during insertion of the test socket 24 for testing. For example, if the interface board 22 is a PCB, the dummy landing area 54 can be or include dummy pads, a solder mask, prepreg, a dielectric material, a conductive material, or any other material. As indicated previously, if dummy pads are included in the dummy landing area, the total array of the frontside pads 52 and dummy pads may be a square array, such as an array of n-columns and n-rows. Subsequent description and illustration is of the array of frontside pads 52 that are capable of testing probes (e.g., by being electrically connected through the interface board 22 to the CRES test system 20)

The array of frontside pads 52 in the pad array area 50 are illustrated in FIG. 2 as having populated corners, although in other examples, some corners may be depopulated. For example, as will become apparent in the context of the illustrated example, the array may be depopulated at the corner where frontside pad 52-A1 is illustrated and at the corner aligned in the same column as, but in distal rows from, frontside pad 52-A1.

Figure 3:
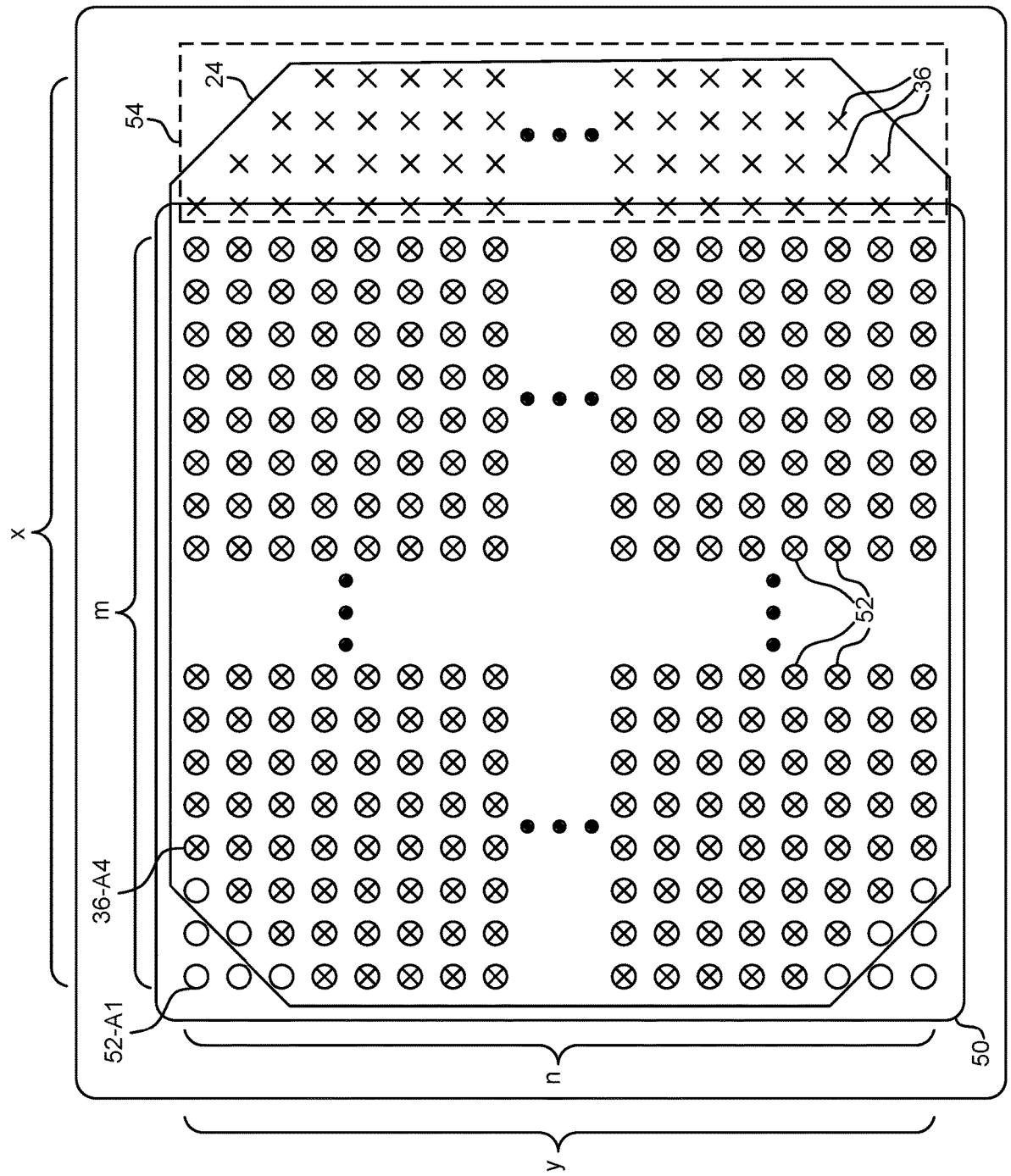
FIGS. 3 and 4 are simplified overlaid views of the layout of the interface board with a test socket thereon, according to some examples.

FIG. 3 illustrates a simplified overlaid view of the layout of the interface board 22 with a test socket 24 thereon, according to some examples. FIG. 3 illustrates an insertion of the test socket 24 for testing. The test socket 24 includes probes 36, like described with respect to FIG. 1. If not sufficiently clear from the figures, each frontside pad 52 is illustrated by a circle, and each probe 36 is illustrated by an "X." The probes 36 are arranged in a square array with depopulation at the corners. The array of the probes 36 as illustrated is x-columns by y-rows, where x and y are equal in this example, which are further equal to n as illustrated. In other examples, the array of probes 36 can be a square array of where x and y can each be (n−i), where i can be any positive integer less than n. In still other examples, the array of probes 36 can be a non-square array.

As illustrated, the probes 36 of column 1 through column m in the array of probes 36 contact the respective frontside pads 52 on the interface board 22, and the probes 36 of column (m+1) through column x in the array of probes 36 may contact dummy landing area 54 (e.g., dummy pads in the dummy landing area 54) of the interface board 22. Hence, the probes 36 of column 1 through column m in the array of probes 36 can be tested by the insertion illustrated in FIG. 3, while probes 36 of column (m+1) through column x are not tested.

Figure 4:
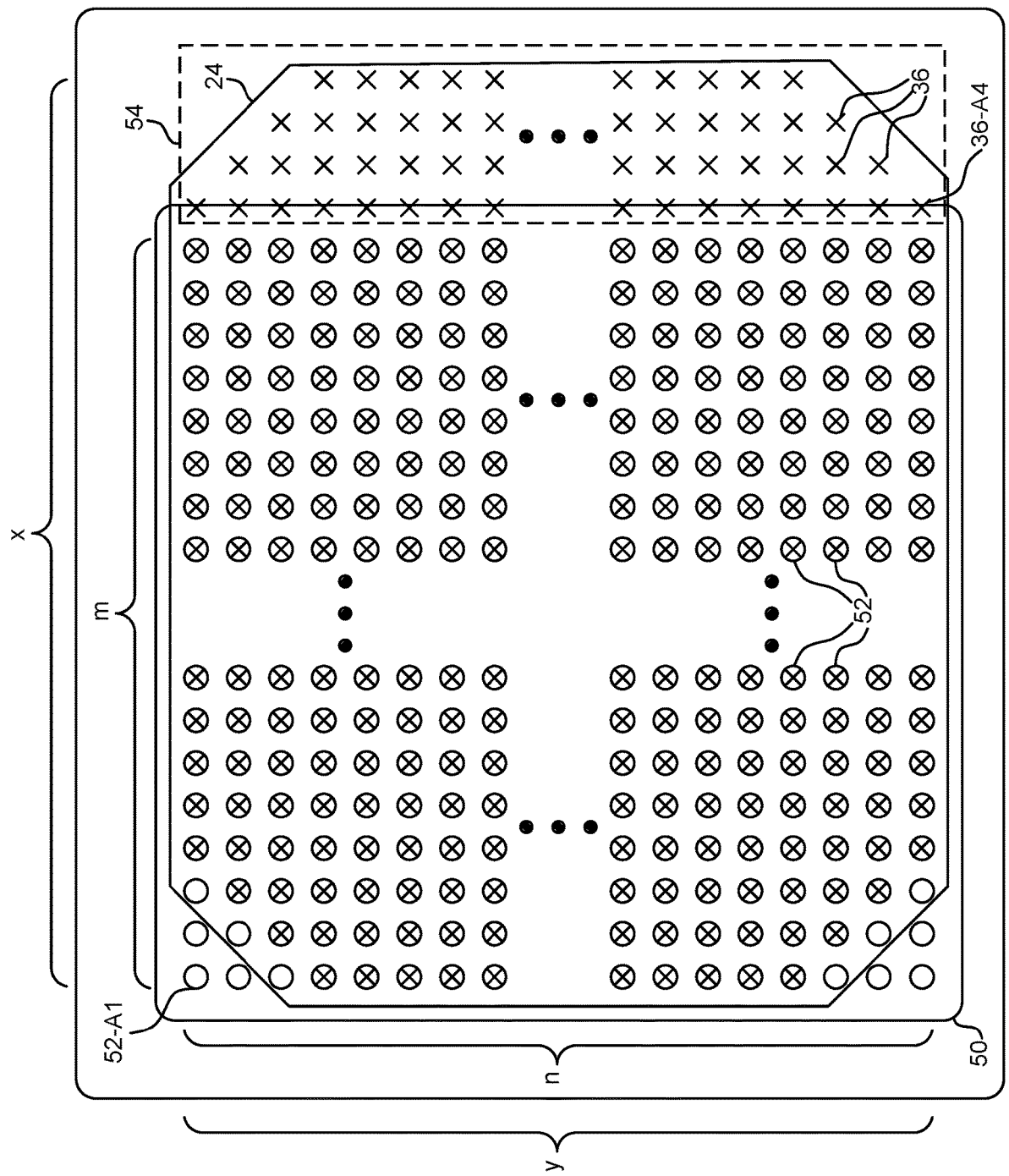

After testing using the insertion illustrated in FIG. 3, the test socket 24 is removed from contacting the interface board 22, is rotated, e.g., 180° around an axis normal to the layout illustrated in FIGS. 2 and 3, and re-inserted to contact the interface board 22. FIG. 4 illustrates a simplified overlaid view of the layout of the interface board 22 with a test socket 24 thereon, according to some examples. FIG. 4 illustrates a subsequent insertion of the test socket 24 for testing after rotating the test socket 24. Probe 36-A4 is illustrated in FIGS. 3 and 4 (relative to the frontside pad 52-A1) to show the rotation of the test socket 24 by 180°.

As illustrated, the probes 36 of column x through column (x−m) in the array of probes 36 contact the respective frontside pads 52 on the interface board 22, and the probes 36 of column (x−m−1) through column 1 in the array of probes 36 may contact dummy landing area 54 (e.g., dummy pads in the dummy landing area 54) of the interface board 22. Hence, the probes 36 of column x through column (x−m) in the array of probes 36 can be tested by the insertion illustrated in FIG. 4, while probes 36 of column (x−m−1) through column 1 are not tested. In some examples, the probes 36 of column (x−m) through column m are not tested during the second insertion (even though those probes 36 contact frontside pads 52) since those probes 36 were tested by the first insertion. In such examples, the probes 36 of column x through column (m+1) are tested by the second insertion.

FIGS. 5 through 8 illustrate an example GUI 34 at various stages of testing corresponding to the illustrated example of FIGS. 3 and 4, according to some examples. The GUI 34 includes a drop-down menu 60 for selecting a file corresponding to the array of probes 36 of the test socket 24 to be tested. The file includes a mapping scheme, a look-up table, or the like that maps channels of the CRES test system 20 based on a given orientation of the test socket 24 to various probes 36 of the test socket 24. The GUI 34 further includes a test control button 62 and a rotate control button 64. The test control button 62 can be selected, e.g., clicked by a mouse tap, by a user, which responsively initiates testing of probes 36 by the CRES test system 20. The rotate control button 64 can be selected, e.g., clicked by a mouse tap, by a user, which responsively indicates the orientation of the test socket 24 relative to the CRES test system 20. The drop-down menu 60 and control buttons 62 and 64 can be grayed out when selecting that control would not be appropriate, for example.

The GUI 34 further includes an array corresponding to the array of probes 36 of the test socket 24 as indicated by the file selected according to the drop-down menu 60. The array can change depending on the selected file. Rows are indicated by an alphabetic reference, and columns are indicated by a numeral reference. In the illustration, rows A through H are labeled for clarity, and columns 1 through 10 are labeled for clarity. Other features may be included in the GUI 34.

Figure 5:
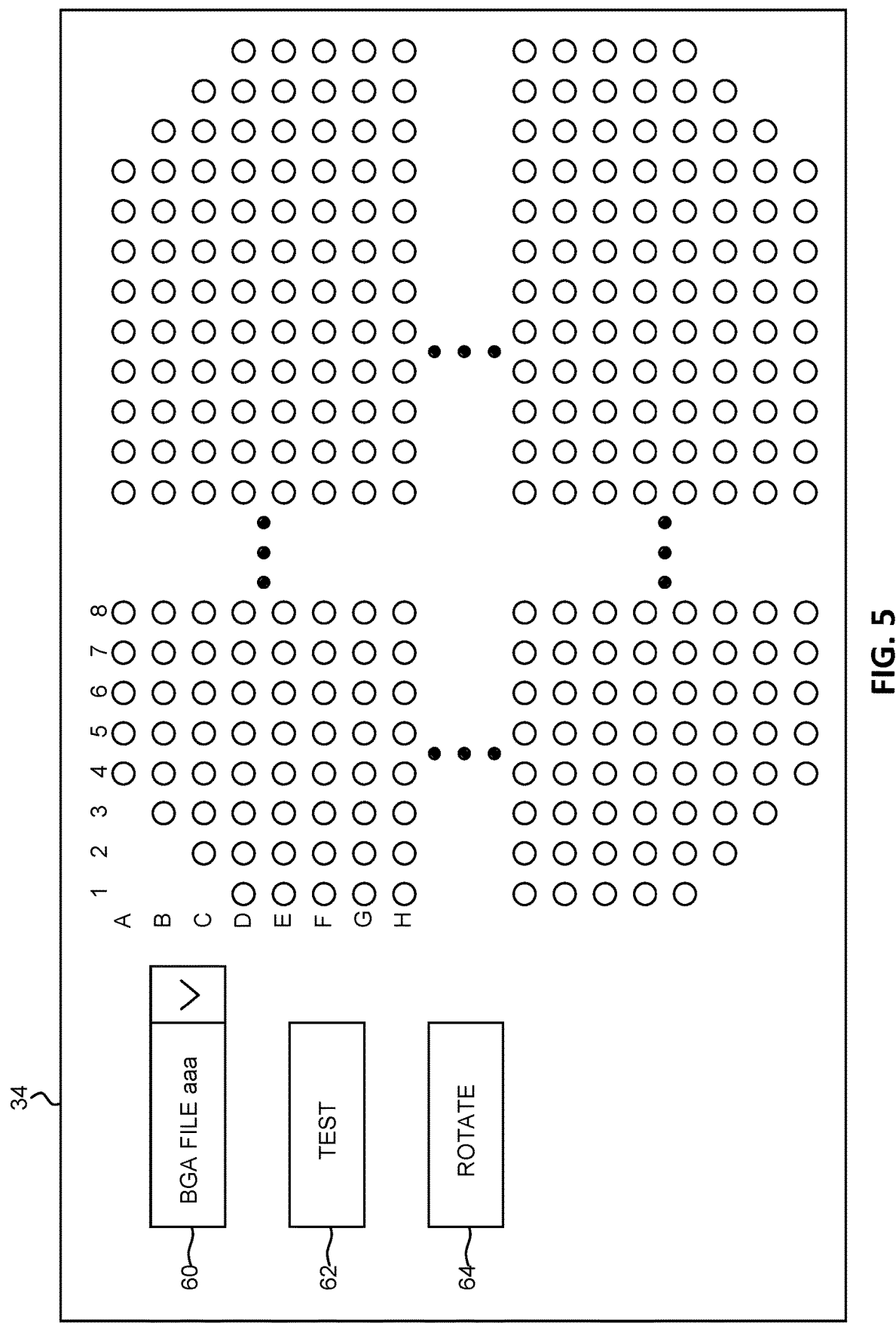
FIGS. 5, 6, 7A, 7B, and 8 are an example graphical user interface (GUI) at various stages of testing, according to some examples.

In FIG. 5, the tester program is initiated on the processor-based system 32, and the GUI 34 is displayed on the display device. The tester program on the processor-based system 32 may establish communication with the CRES test system 20. A user selects a file by the drop-down menu 60 corresponding to the array of probes 36 of the test socket 24 to be tested. The tester program causes the GUI 34 to responsively display the array based on the selected file.

The user inserts the test socket 24 on the interface board 22 (e.g., through the frame 26). The tester program can assume that the first insertion aligns the A1 corner of the array of probes 36 of the test socket 24 to the A1 corner of the array of frontside pads 52 on the interface board 22 and/or can prompt the user to so align the test socket 24. Inserting the test socket 24 such that the A1 corner of the array of probes 36 of the test socket 24 is aligned to the A1 corner of the array of frontside pads 52 on the interface board 22 results in the various probes 36 contacting the frontside pads 52 as illustrated in and described with respect to FIG. 3. The user then places the shorting device 38 on the test socket 24 to short the probes 36, and closes the lid 28 to secure the shorting device 38 on the test socket 24.

Figure 6:
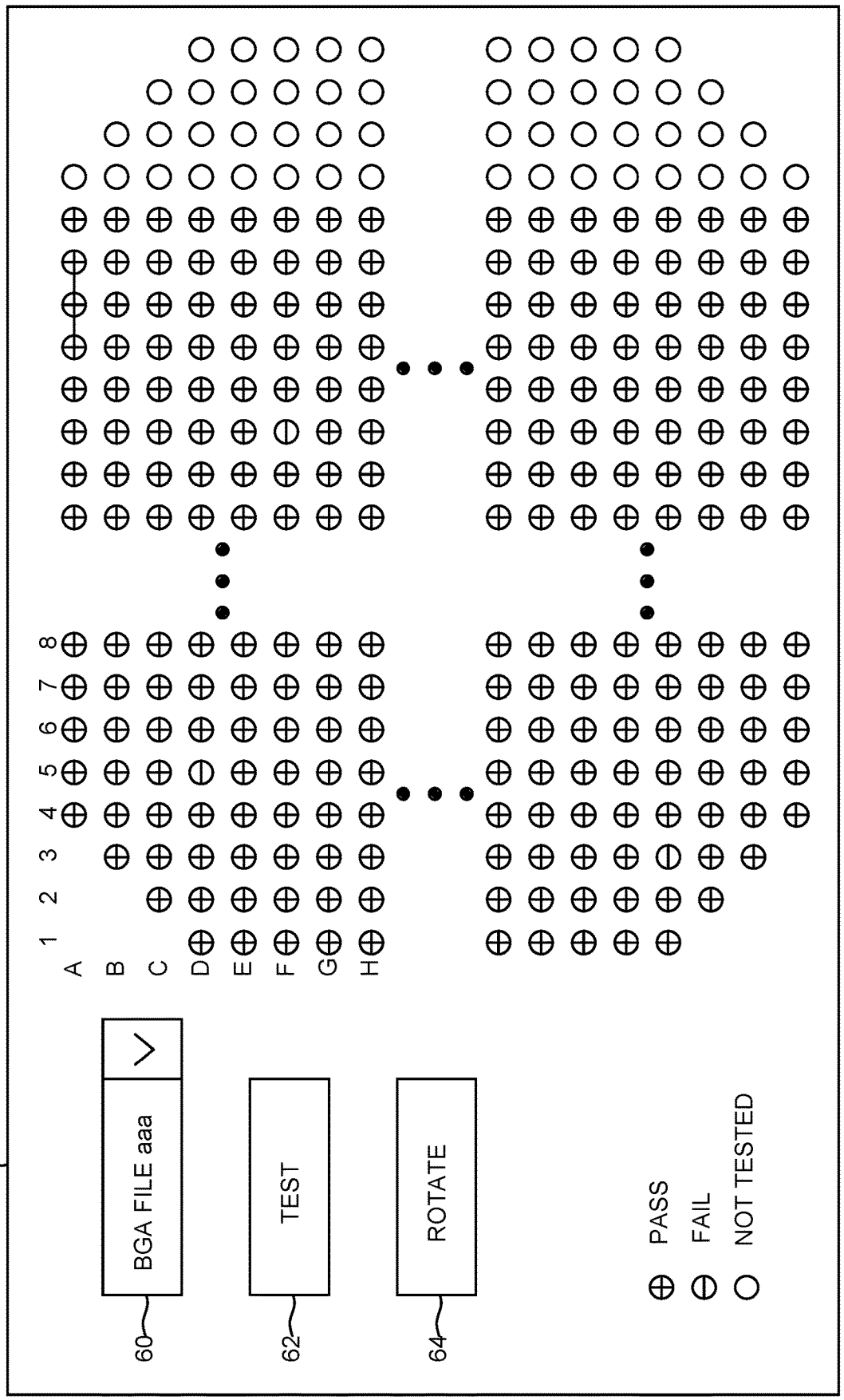

The user then selects the test control button 62 in the GUI 34, which causes the tester program to responsively initiate testing of the probes 36 by the CRES test system 20. The CRES test system 20 can apply a voltage to various combinations of probes 36 via the interface board 22 and detect a current for the closed-loop circuit of each combination of probes 36. Using the applied voltage and detected current, the CRES test system 20 can determine a resistance of each closed-loop circuit, and by having various combination of probes 36, the CRES test system 20 can isolate the resistance of each probe 36 based on the resistances of different closed-loop circuits. The CRES test system 20 can communicate the results of the testing to the tester program, which can responsively identify each result from a channel with a corresponding probe of the array as indicated by the selected file and orientation of the test socket 24. FIG. 6 illustrates the GUI 34 showing the results of the testing of the first insertion. As described with respect to FIG. 3, probes 36 of column (m+1) through column x of the array of probes 36 are not tested by the first insertion, and hence, FIG. 6 illustrates that those probes 36 are not tested. The tester program can store the results, such as organized by channel and test socket orientation or by probe location, in memory, such as in a file or other object.

The user then removes the test socket 24 from the interface board 22 (e.g., opens the lid 28 and removes the shorting device 38 and test socket 24 from the frame 26), rotates the test socket 24, e.g., 180°, and re-inserts the test socket 24 on the interface board 22 (e.g., through the frame 26). The tester program can assume that the second insertion aligns the A1 corner of the array of probes 36 of the test socket 24 rotated, e.g., 180° relative to the A1 corner of the array of frontside pads 52 on the interface board 22 and/or can prompt the user, via the GUI 34, to so rotate and align the test socket 24. Inserting the test socket 24 such that the A1 corner of the array of probes 36 of the test socket 24 is rotated, e.g., 180° relative to the A1 corner of the array of frontside pads 52 on the interface board 22 results in the various probes 36 contacting the frontside pads 52 as illustrated in and described with respect to FIG. 4. The user then places the shorting device 38 on the test socket 24 to short the probes 36, and closes the lid 28 to secure the shorting device 38 on the test socket 24.

Figure 7A:
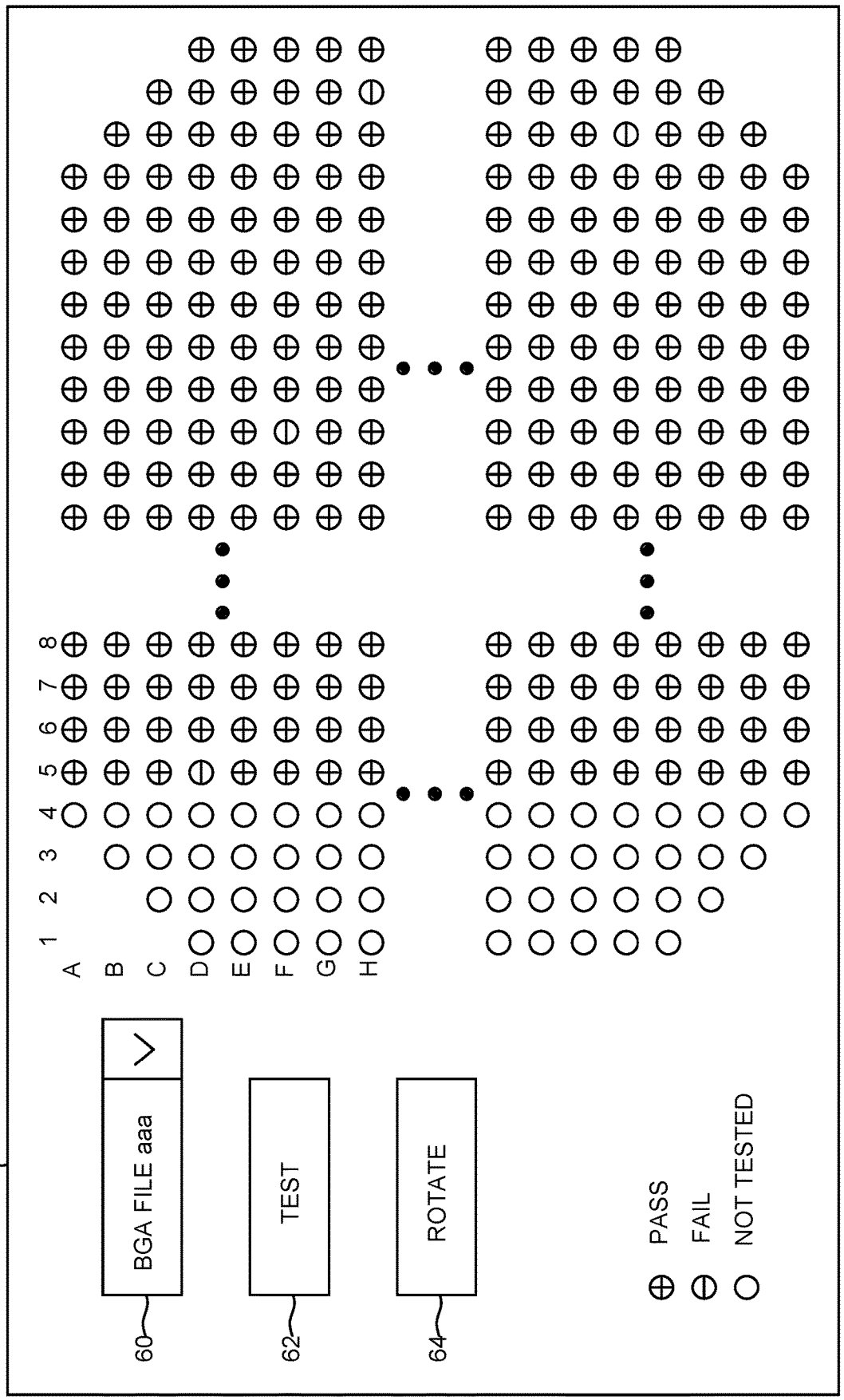
Figure 7B:
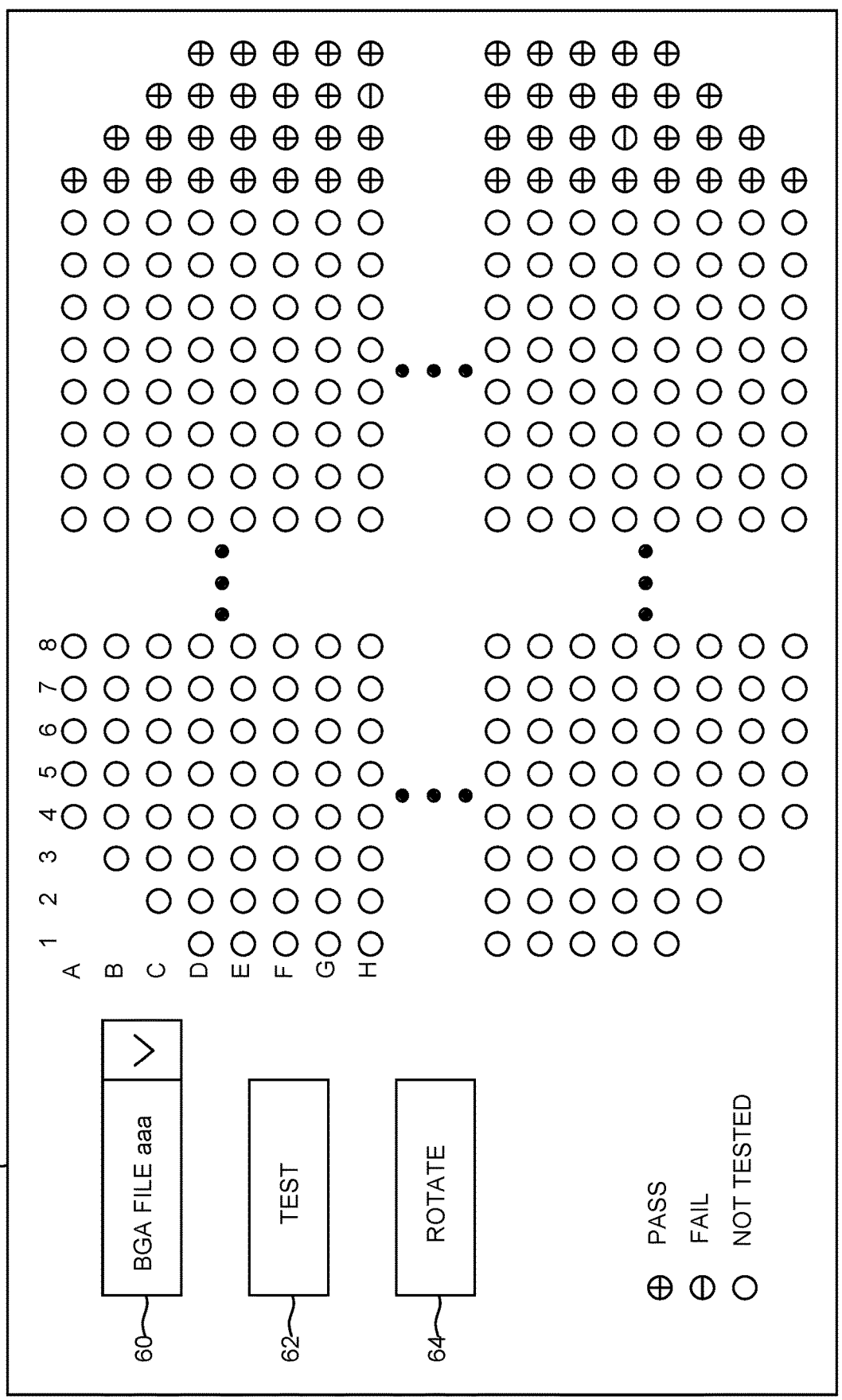

The user selects the rotate control button 64 to indicate that the orientation of the test socket 24 has been rotated and then selects the test control button 62 in the GUI 34, which causes the tester program to responsively initiate testing of the probes 36 by the CRES test system 20. The CRES test system 20 can communicate the results of the testing to the tester program, which can responsively identify each result from a channel with a corresponding probe of the array as indicated by the selected file and orientation of the test socket 24. FIG. 7A illustrates the GUI 34 showing the results of the testing of the second insertion when the probes 36 that contact a frontside pad 52 are tested. As described with respect to FIG. 4, probes 36 of column 1 through column (x−m−1) of the array of probes 36 are not tested by the second insertion, and hence, FIG. 7A illustrates that those probes 36 are not tested. FIG. 7B illustrates the GUI 34 showing the results of the testing of the second insertion when the probes 36 that were not tested by the first insertion are tested. As also described with respect to FIG. 4, probes 36 of column 1 through column m of the array of probes 36 may not be tested by the second insertion, and hence, FIG. 7B illustrates that those probes 36 are not tested. The tester program can track which probes 36 have been previously tested (e.g., using the selected mapping file) and responsively control which probes 36 the CRES test system 20 tests.

Figure 8:
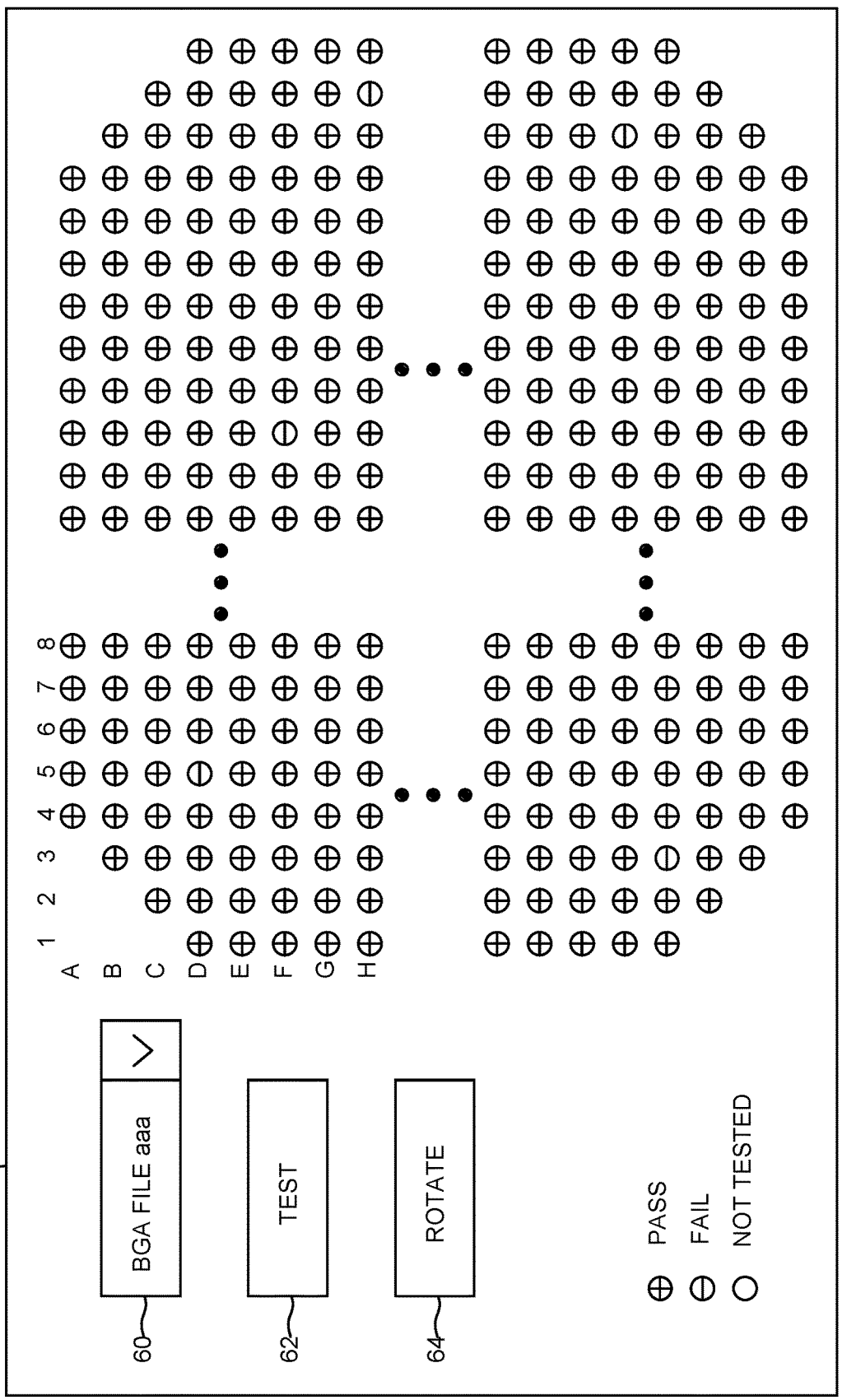

The tester program can store the results, such as organized by test channel and test socket orientation or by probe location, in memory, such as in a file or other object, which may further include the results of the first insertion and testing. FIG. 8 illustrates the combined results of the first insertion and second insertion to show that each probe 36 of the test socket 24 can be tested by using multiple insertions.

After testing the probes 36 of the test socket 24, the test socket 24 can be reworked to address any failing probe 36. For example, a failing probe 36 can be removed from the test socket 24 and replaced by another probe. The test socket 24 may undergo further testing to ensure that the replaced probes 36 pass testing.

Figure 9:
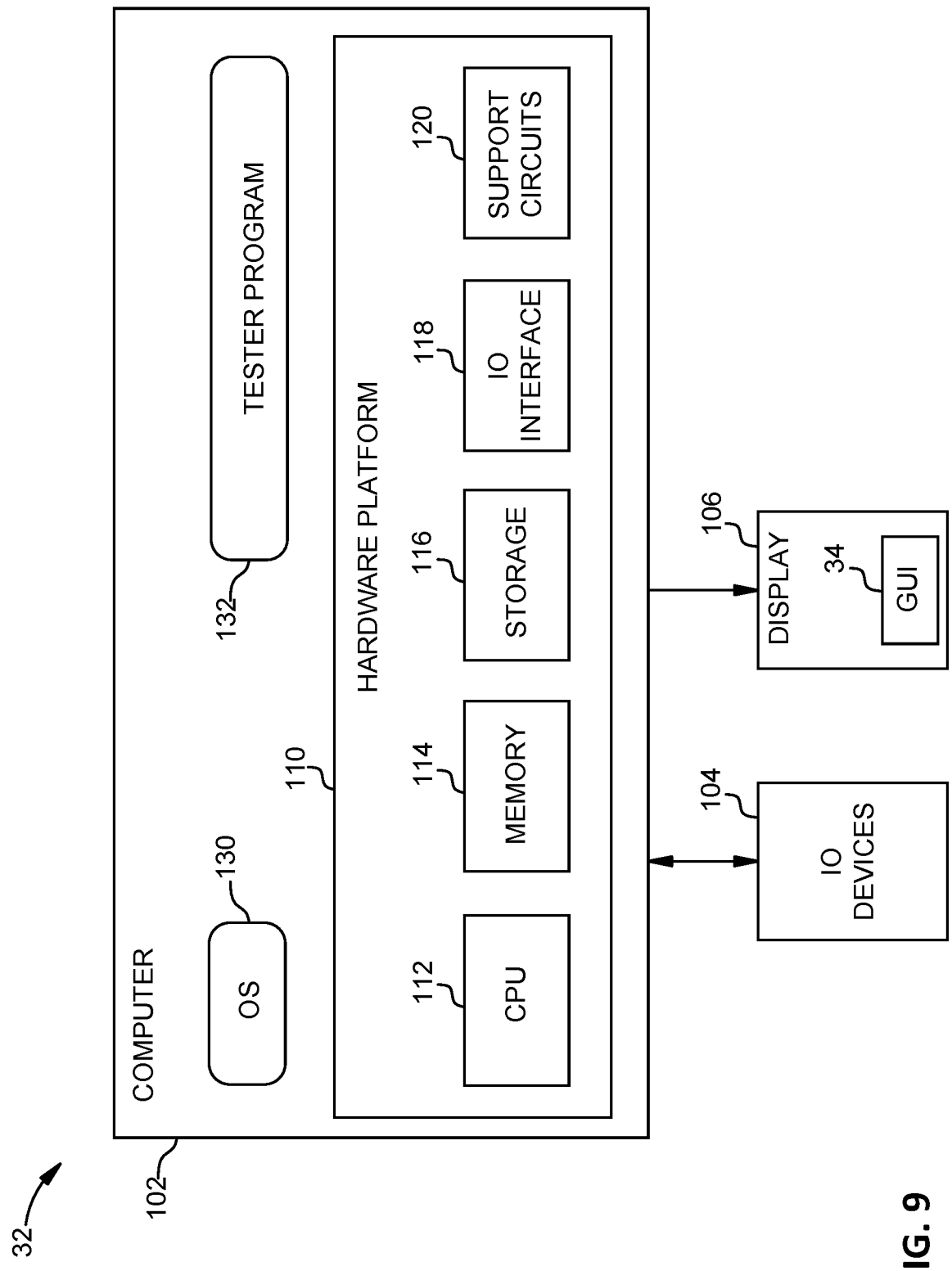
FIG. 9 is a block diagram depicting an example of a processor-based system, according to some examples.

FIG. 9 is a block diagram depicting an example of a processor-based system 32, in accordance with some examples. The processor-based system 32 includes a computer 102 coupled to input/output (IO) devices 104 and a display device 106. The computer 102 includes a hardware platform 110 that can include components of a computing device, such as a central processing unit (CPU) 112, system memory 114, storage 116, an input/output (IO) interface 118, and various support circuits 120. The CPU 112 can include one or more microprocessors. The CPU 112 is configured to execute instructions that perform one or more operations described herein. The instructions can be stored in non-transitory memory, such as system memory 114, storage 116, or any other memory in the hardware platform 110 (e.g., cache memory). The system memory 114 includes one or more devices that store information and can include, for example, random access memory (RAM), read-only memory (ROM), or a combination thereof. The storage 116 includes one or more local storage devices, such as hard disks, flash memory modules, solid state disks, optical disks, and the like. The storage 116 can also include interface(s) configured for communication with one or more network data storage systems. The IO interface 118 includes interfaces to/from the computer 102. The IO interface 118 can be coupled to the IO devices 104, which can include a keyboard, mouse, and the like. In some examples, the IO interface 118 provides a communication interface with the CRES test system 20. The IO interface 118 can also be coupled to the display device 106, which can present the GUI 34 to a user. The support circuits 120 can include cache, power supplies, clock circuits, data registers, IO interfaces, and the like.

The computer 102 further includes a software platform comprising an operating system (OS) 130 and a tester program 132. The OS 130 and the tester program 132 include instructions that are executed by the CPU 112, which instructions can be stored in system memory 114, storage 116, or any other memory. The OS 130 can include any known operating system, such as Linux®, Microsoft Windows®, Mac OS®, and the like. The tester program 132 is an application that executes within the OS 130, which provides an interface to the hardware platform 110. Some operations of the tester program 132 are described above, which permit control to and communication with the CRES test system and display of the GUI 34 on the display device 106.

To provide a specific example, assume that the CRES test system 20 has 2600 test channels. This would result in the maximum square array size of a test socket that could be tested by a single insertion (and corresponding interface board) to be 51×51 (corresponding to a 52.5 mm×52.5 mm package size according to the JEDEC standard), with depopulation at the corners. This would result in 2577 channels being used by the single insertion test.

An interface board having an array of frontside pads that is 48×54, without depopulation at the corners, can implement 2592 channels. Using two insertions as described above, the CRES test system with such an interface board can test a test socket with a maximum square array size of 54×54 (corresponding to a 55 mm×55 mm package size according to the JEDEC standard), which can have 2892 probes with depopulation at the corners of the array of probes. The first insertion can test probes of column 1 through column 48 (e.g., 2580 probes are tested), and the second insertion can test probes of column 7 through column 54 (e.g., 2580 probes are tested), which together test all probes of column 1 through column 54. Or, in another example, the first insertion can test probes of column 1 through column 48 (e.g., 2580 probes are tested), and the second insertion can test probes of columns 49 through 54 (e.g., 312 probes are tested), which together test all probes of columns 1 through 54. Table 1 below lists some example test socket probe array sizes (with or without depopulation depending on size) and corresponding number of insertions to test the test socket using this interface board.

TABLE 1

| Test Socket Probe Array Size | Number of Probes | Package Size | Number of Insertions |
| --- | --- | --- | --- |
| 54 × 54 | 2892 | 55 mm × 55 mm | 2 |
| 51 × 51 | 2577 | 52.5 mm × 52.5 mm | 2 |
| 49 × 49 | 2377 | 50 mm × 50 mm | 2 |
| 46 × 46 | 2104 | 47.5 mm × 47.5 mm | 1 or 2 |
| 44 × 44 | 1924 | 45 mm × 45 mm | 1 |
| 42 × 42 | 1760 | 42.5 mm × 42.5 mm | 1 |
| 39 × 39 | 1517 | 40 mm × 40 mm | 1 |
| 34 × 34 | 1156 | 35 mm × 35 mm | 1 |
| 30 × 30 | 900 | 31 mm × 31 mm | 1 |

As a note, for some examples of a 46×46 array size as indicated in Table 1, two insertions may be implemented, such as due to mechanical constraints (e.g., placement of alignment pins). In other examples, such mechanical constraints may not exist, and one insertion may be implemented for a 46×46 array size.

As indicated above, and again assuming 2600 channels of the CRES test system, an interface board having a square array of frontside pads could test a test socket with a 51×51 array of probes using one insertion, and an interface board having a 48×54 array of frontside pads can test a test socket with a 51×51 array of probes using two insertions. However, the interface board having a square array of frontside pads would not be able to test a test socket with a 54×54 array of probes without many more insertions and added complexity to the tester program that controls the testing, whereas the interface board having a 48×54 array of frontside pads can test a test socket with a 54×54 array of probes using two insertions as described above.

The general concepts of the examples described above can be further extended for two insertion testing. Assuming a defined number of channels c in a CRES test system and two insertions, the array of frontside pads on the interface board can be any size where the number of columns m is greater than or equal to half of the number of rows n (m≥n/2), and the number of channels c is greater than or equal to the number of columns m times the number of rows n (c≥m*n). This can permit testing a test socket with an array of probes that has a size of x-columns by g-rows, where the number of columns x and the number of rows y are equal to each other and equal to or less than the number of rows n of the array of frontside pads on the interface board. For example, with a CRES test system having 2600 channels, the interface board can have an array of frontside pads that is 36 columns (m=36) by 72 rows (n=72), such that 2592 channels are used. This can result in a test socket with an array of probes having a size of 72 columns by 72 rows being able to be tested by two insertions, where columns 1 through 36 are tested by the first insertion, and columns 37 through 72 are tested by the second insertion.

The two insertion testing can be compatible with alignment holes implemented in test sockets. Generally, the symmetry of alignment holes permits the 180° rotation described above for the two insertions. If alignment holes are reconfigured or are not used, more insertions may be implemented to further extend the size of the array of probes of a test socket that can be tested by an interface board and CRES test system. For example, FIG. 10 generally illustrates testing using four insertions, according to some examples. The probes 36 are not illustrated in FIG. 10 to avoid obscuring other features. The array of probes 36 is x-columns by y-rows, where x and y are equal, and the array of frontside pads 52 is m-columns by n-rows. In this example where four insertions are implemented, the number of columns m is greater than or equal to half of the number of columns x (or number of rows y), and the number of rows n is greater than or equal to half of the number of rows y (or number of columns x). As shown, the test socket 24 can be rotated 202a, 202b, and 202c three times after the initial insertion, with each rotation being 90° and corresponding to a separate insertion. In other examples, and as shown, the test socket 24 can be translated 204a, 204b, and 204c three times after the initial insertion, with each translation corresponding to a separate insertion. Any number of insertions can be implemented. The size of an array of probes of a test socket to be tested using multiple insertions can extend (such as to an array of 101×101 probes) the testing capabilities of a CRES test system that implements a single insertion.

Figure 10:
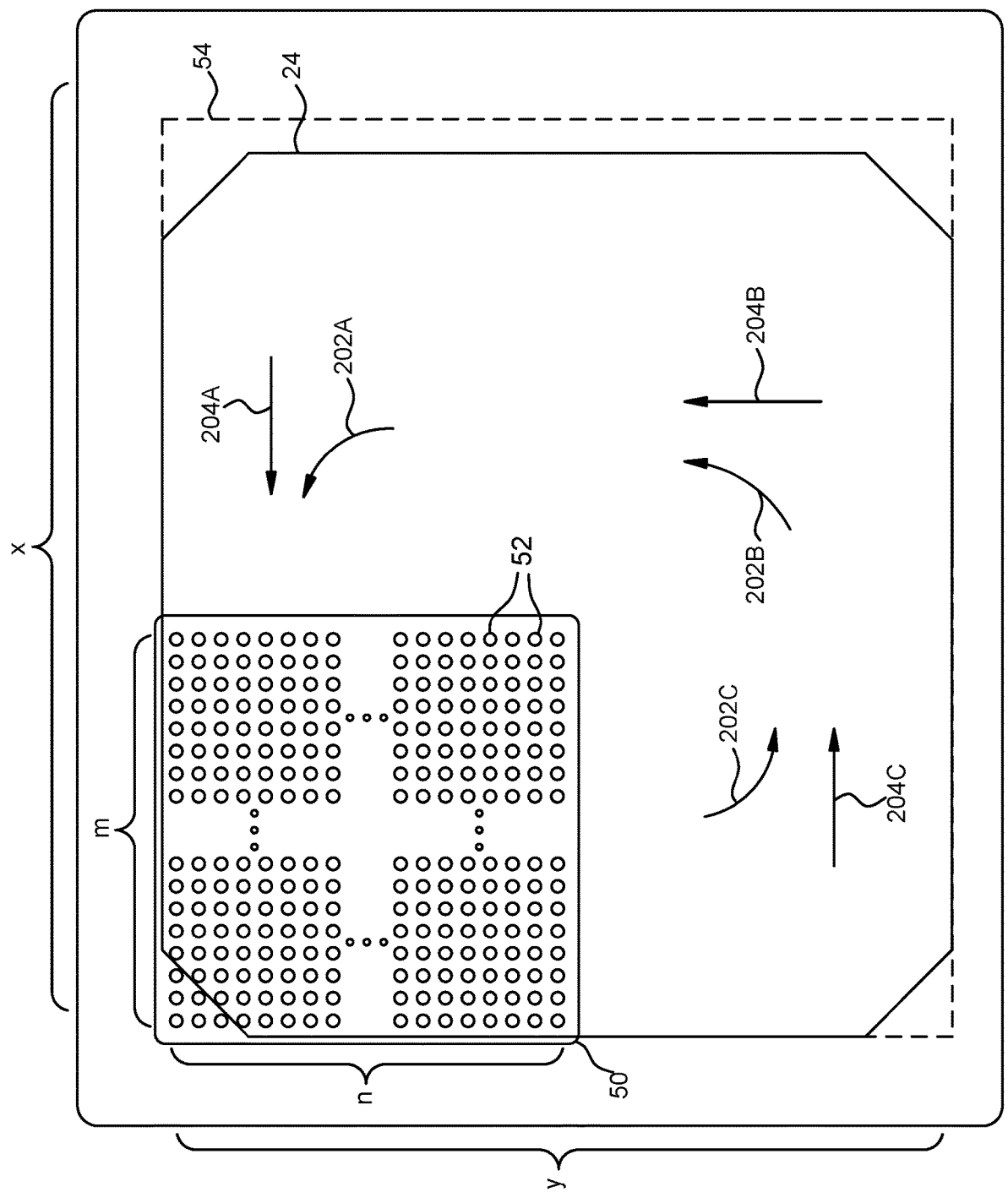
FIG. 10 is a simplified overlaid view of a layout of an interface board with a test socket thereon for testing using four insertions, according to some examples.
Figure 11:
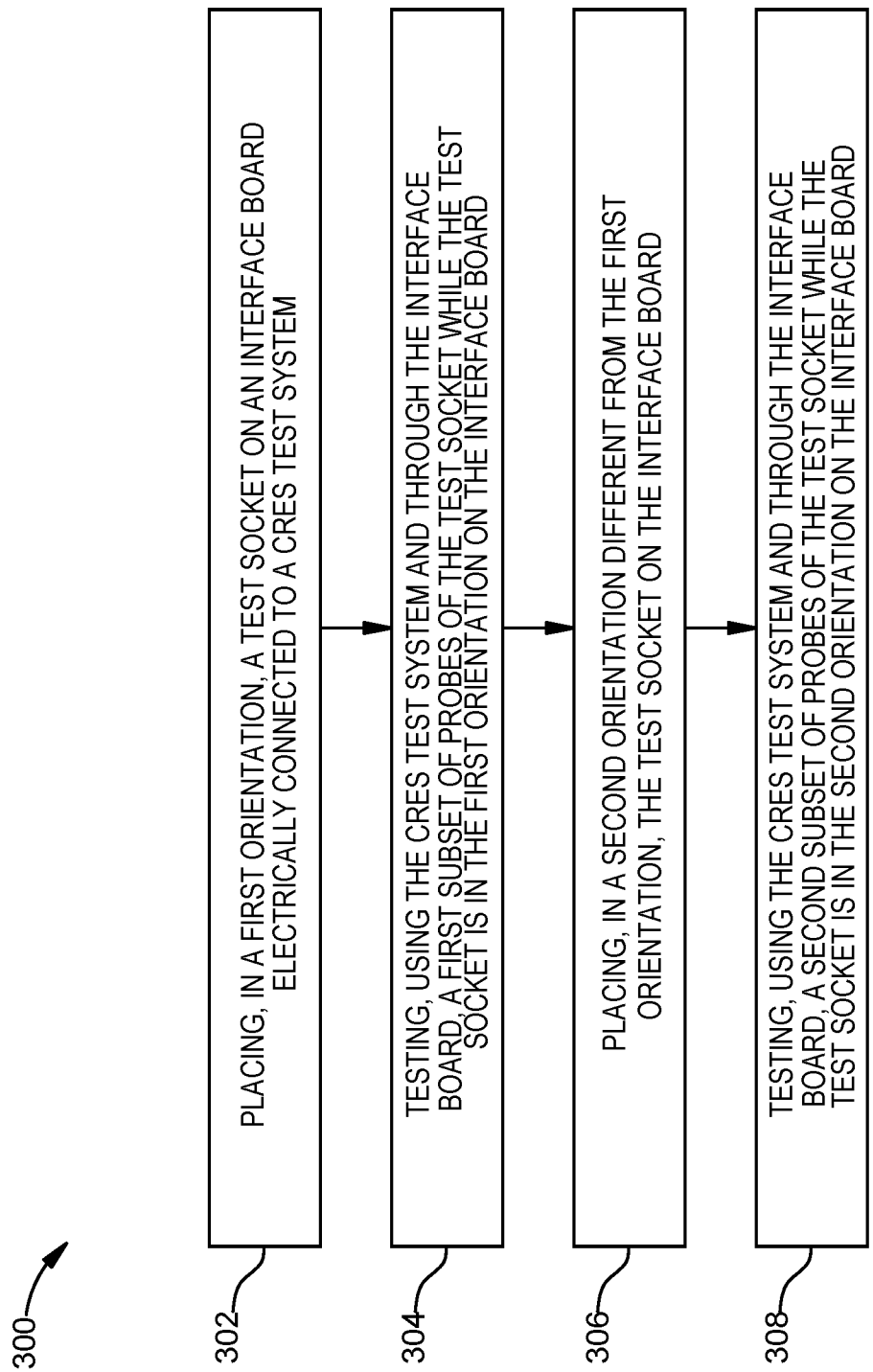
FIG. 11 is a flowchart of a method for testing a test socket using multiple insertions, according to some examples.

FIG. 11 is a flowchart of a method 300 for testing a test socket using multiple insertions, according to some examples. The method 300 is described using two insertions, but more insertions may be implemented as illustrated by FIG. 10. In operation 302, a test socket is placed in a first orientation on an interface board that is electrically connected to a CRES test system. FIG. 3 illustrates an example orientation of a test socket placed on an interface board. In operation 304, a first subset of probes of the test socket is tested using the CRES test system and through the interface board while the test socket is in the first orientation on the interface board. As described with respect to FIG. 3, a first subset of probes including probes of column 1 through column m is tested, while a second subset of probes including probes of column (m+1) through column x is not tested. In operation 306, the test socket is placed in a second orientation different from the first orientation on the interface board. FIG. 4 illustrates an example orientation of the test socket placed on an interface board. In operation 308, the second subset of probes of the test socket is tested using the CRES test system and through the interface board while the test socket is in the second orientation on the interface board. As described with respect to FIG. 4, the second subset of probes including probes of column x through column (m+1) is tested, while at least some of the first subset of probes including probes of column (x−m−1) through column 1 is not tested.

Figure 12:
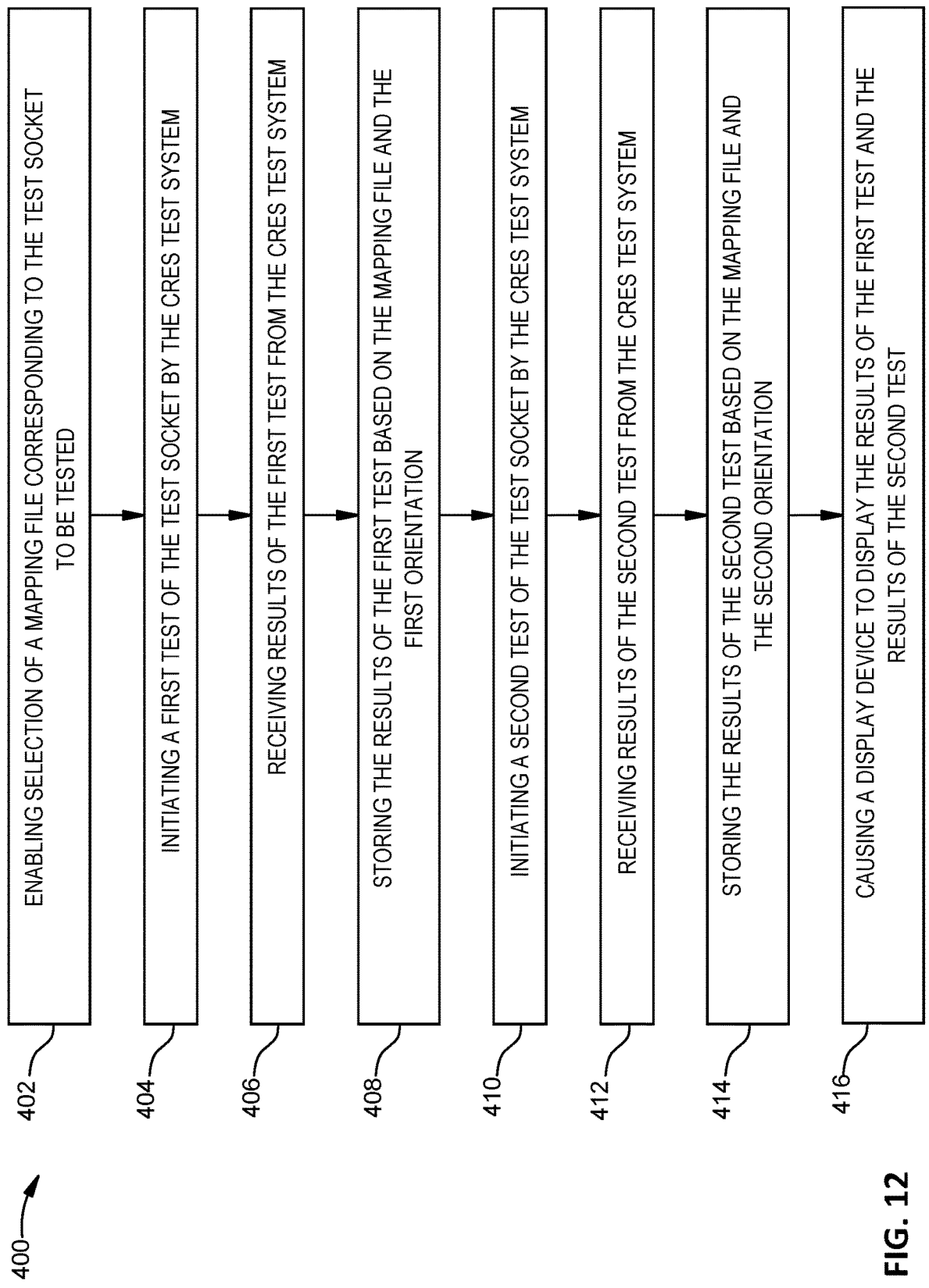
FIG. 12 is a flowchart of a method for controlling testing of a test socket using multiple insertions, according to some examples.

FIG. 12 is a flowchart of a method 400 for controlling testing of a test socket using multiple insertions, according to some examples. The method 400 can be implemented by a tester program operating on a processor-based system. The method 400 is described using two insertions, but more insertions may be implemented.

In operation 402, selection of a mapping file corresponding to the test socket to be tested is enabled. The mapping file can be based on a first orientation of the test socket during testing and a second orientation of the test socket, different from the first orientation, during testing. For example, the first orientation of the test socket can be as illustrated in FIG. 3, and the second orientation of the test socket can be as illustrated in FIG. 4. The selection of the mapping file can be by a drop-down menu, such as described with respect to FIG. 5. The drop-down menu can provide a list of possible different test sockets (and their corresponding probe array sizes) that are able to be tested. The selection of a particular mapping file for a test socket can indicate whether multiple insertions will be implemented and the mapping of channels from the CRES test system to probes of the test socket (which may further be based on the orientation of the test socket during testing when multiple insertions are used).

In operation 404, a first test of the test socket by the CRES test system is initiated. The first test can be based on the first orientation as indicated by the mapping file. For example, as described with respect to FIG. 5, the first test can be initiated in response to selection of a test control button. The initiating of the first test can cause the CRES test system to begin testing probes of the test socket as previously described.

In operation 406, results of the first test are received from the CRES test system. The results can be received via channels of the CRES test system, and the results can be mapped, based on the channels through which the results are received, to various probes of the test socket under test using the mapping file and according to the first orientation. In operation 408, the results of the first test are stored based on the mapping file and the first orientation. Further, in some examples, the results of the first test can be caused to be displayed by a display device, such as illustrated in FIG. 6.

In operation 410, a second test of the test socket by the CRES test system is initiated. The first test can be based on the second orientation as indicated by the mapping file. For example, as described with respect to FIG. 6, the second test can be initiated in response to selection of a rotate and/or test control button. The initiating of the second test can cause the CRES test system to begin testing probes of the test socket as previously described.

In operation 412, results of the second test are received from the CRES test system. The results can be received via channels of the CRES test system, and the results can be mapped, based on the channels through which the results are received, to various probes of the test socket under test using the mapping file and according to the second orientation. In operation 414, the results of the second test are stored based on the mapping file and the second orientation. The storing of the results of the second test may be in a same file or object in which the results of the first test are stored. Further, in some examples, the results of the first test can be caused to be displayed by a display device, such as illustrated in FIG. 7A or 7B. In operation 416, a display device is caused to display the results of the first test and the results of the second test. This may be performed by separately displaying the results, such as illustrated by FIGS. 6 and 7A or 7B, and/or by displaying the results together, such as illustrated by FIG. 8.

Examples described herein can extend the testing capabilities of a CRES test system. Hence, for example, larger test socket probe arrays can be tested without having to purchase a new and costly CRES test system to accommodate the larger arrays. Further, examples described herein are flexible to test multiple different test socket probe array sizes. The test socket probe array sizes can be even (e.g., x-columns and/or y-rows can be even) or odd (e.g., x-columns and/or y-rows can be odd). The concepts described herein can be extended to various implementations.

While the foregoing is directed to specific examples, other and further examples may be devised without departing from the basic scope thereof, and the scope thereof is determined by the claims that follow.

What is claimed is:

1. A method for testing a test socket, the method comprising:
   placing, in a first orientation, the test socket on an interface board electrically connected to a test system;
   testing, using the test system and through the interface board, a first subset of probes of the test socket while the test socket is in the first orientation on the interface board;
   placing, in a second orientation different from the first orientation, the test socket on the interface board; and
   testing, using the test system and through the interface board, a second subset of probes of the test socket while the test socket is in the second orientation on the interface board, at least some probes of the second subset of probes being different from the first subset of probes.

2. The method of claim 1, wherein:
   when the test socket is placed in the first orientation on the interface board, the at least some probes of the second subset of probes contact a dummy landing area of the interface board; and
   when the test socket is placed in the second orientation on the interface board, at least some probes of the first subset of probes contact the dummy landing area of the interface board.

3. The method of claim 1, wherein:
   the interface board comprises pads arranged in a pad array, the pads being electrically connected to the test system through the interface board;
   the pad array has a number of rows of pads and a number of columns of pads, the number of rows of pads being greater than the number of columns of pads; and
   the first subset of probes contacts at least some of the pads when the test socket is placed in the first orientation on the interface board; and
   the second subset of probes contacts at least some of the pads when the test socket is placed in the second orientation on the interface board.

4. The method of claim 1, wherein:
   the test socket comprises the first subset of probes and the second subset of probes in a probe array;
   the probe array has a number of rows of probes and a number of columns of probes, the number of rows of probes being equal to the number of columns of probes;
   the first subset of probes is probes in the probe array in a first outer column through a first intermediate column; and
   the second subset of probes includes probes in the probe array in a second intermediate column to a second outer column, the second outer column being on an opposite side of the probe array from the first outer column, the second intermediate column neighboring the first intermediate column, the first intermediate column being disposed between the second intermediate column and the first outer column.

5. The method of claim 1, wherein, in the second orientation, the test socket is rotated 180° relative to the first orientation.

6. The method of claim 1, wherein, in the second orientation, the test socket is rotated 90° relative to the first orientation.

7. The method of claim 1, wherein, in the second orientation, the test socket is translated relative to the first orientation.

8. A testing apparatus comprising:
a contact resistance (CRES) test system; and
an interface board on the CRES test system, the interface board having backside pads that are electrically connected to external connectors of the CRES test system, the interface board having frontside pads arranged in a pad array, the frontside pads being electrically connected to the backside pads via interconnects of the interface board, the pad array having a number of columns of frontside pads and a number of rows of frontside pads, the number of rows of frontside pads being greater than the number of columns of frontside pads, wherein the interface board includes a dummy landing area neighboring the pad array, the dummy landing area including dummy pads, wherein, when a test socket having a probe array having a number of columns of probes that is greater than the number of columns of frontside pads is inserted on the interface board, a subset of probes of the probe array contacts the dummy pads.

9. The testing apparatus of claim 8 further comprising:
a frame mechanically attached to the CRES test system, the interface board, or a combination thereof; and
a lid mechanically attached to the frame, the frame and the lid being configured to secure a test socket on the interface board when the test socket is inserted in the frame and the lid is in a closed position.

10. A testing apparatus comprising:
a contact resistance (CRES) test system;
an interface board on the CRES test system, the interface board having backside pads that are electrically connected to external connectors of the CRES test system, the interface board having frontside pads arranged in a pad array, the frontside pads being electrically connected to the backside pads via interconnects of the interface board, the pad array having a number of columns of frontside pads and a number of rows of frontside pads, the number of rows of frontside pads being greater than the number of columns of frontside pads; and
a processor-based system communicatively coupled to the CRES test system, the processor-based system comprising:
a processor; and
a computer-readable medium storing instructions which, when executed by the processor, cause the processor to perform operations, the operations comprising:
enabling selection of a mapping file corresponding to a test socket to be tested, the mapping file being based on a first orientation of the test socket during testing and a second orientation of the test socket, different from the first orientation, during testing;
initiating a first test of the test socket by the CRES test system, the first test being based on the first orientation of the test socket;
receiving results of the first test from the CRES test system;
storing the results of the first test based on the mapping file and the first orientation;
initiating a second test of the test socket by the CRES test system, the second test being based on the second orientation of the test socket;
receiving results of the second test from the CRES test system; and
storing the results of the second test based on the mapping file and the second orientation.

11. The testing apparatus of claim 10, wherein the second orientation is rotated 180° from the first orientation.

12. The testing apparatus of claim 10, wherein the operations further include causing a display device to display the results of the first test and the results of the second test.

13. The testing apparatus of claim 10, wherein initiating the second test is in response to an input that the test socket has been changed from the first orientation to the second orientation.

14. The testing apparatus of claim 10, wherein:
initiating the first test causes the CRES test system to test, via the frontside pads of the interface board, a first subset of probes of the test socket based on the first orientation of the test socket, wherein a second subset of probes of the test socket do not contact the frontside pads in the first orientation; and
initiating the second test causes the CRES test system to test, via at least some of the frontside pads, the second subset of the probes of the test socket based on the second orientation of the test socket.

15. A method for testing a test socket, the method comprising:
placing a first subset of a square array of probes of the test socket in electrical contact with at least some of an array of pads on an interface board, the array of pads being electrically connected to a test system, wherein, when placed, a second subset of the square array of probes is not in electrical contact with the array of pads;
testing, using the test system and through the at least some of the array of pads, the first subset of the square array of probes of the test socket;
placing the second subset of the square array of probes of the test socket in electrical contact with the at least some of the array of pads on the interface board, wherein, when placed, at least some of the first subset of the square array of probes are not in electrical contact with the array of pads; and
testing, using the test system and through the at least some of the array of pads, the second subset of the square array of probes of the test socket.

16. The method of claim 15, wherein placing the second subset of the square array of probes of the test socket in electrical contact with the at least some of the array of pads includes rotating the test socket a rotation relative to the placing the first subset of the square array of probes of the test socket in electrical contact with the at least some of the array of pads.

17. The method of claim 15, wherein:
the array of pads has a first number of columns;

the square array of probes has a second number of columns greater than the first number of columns;

the first subset of the square array of probes includes probes in the first number of columns starting at a first outer column and through a first intermediate column of the square array of probes; and the second subset of the square array of probes includes probes in a number of columns that is the second number of columns minus the first number of columns starting at a second outer column and through a second intermediate column of the square array of probes, the second outer column being opposite from the first outer column.

18. The method of claim 15, wherein:

placing the first subset of the square array of probes in electrical contact with the at least some of the array of pads includes:

placing probes of the square array of probes that are in a first outer column through a first intermediate column of the square array of probes in electrical contact with the at least some of the array of pads; and placing probes of the square array of probes that are in a second intermediate column through a second outer column of the square array of probes in contact with a dummy landing area of the interface board; and placing the second subset of the square array of probes in electrical contact with the at least some of the array of pads includes:

placing the probes of the square array of probes that are in the second intermediate column through the second outer column of the square array of probes in electrical contact with the at least some of the array of pads; and placing at least some of the probes of the square array of probes that are in the first outer column through the first intermediate column of the square array of probes in contact with the dummy landing area.

19. The method of claim 16, wherein the rotation is 180°.

* * * * *